(12) United States Patent
Risaki

(10) Patent No.: US 7,492,035 B2
(45) Date of Patent: Feb. 17, 2009

(54) SEMICONDUCTOR DEVICE AND METHOD OF MANUFACTURING THE SAME

(75) Inventor: Tomomitsu Risaki, Chiba (JP)

(73) Assignee: Seiko Instruments Inc. (JP)

( * ) Notice: Subject to any disclaimer, the term of this patent is extended or adjusted under 35 U.S.C. 154(b) by 145 days.

(21) Appl. No.: 11/397,470

(22) Filed: Apr. 4, 2006

(65) Prior Publication Data
US 2006/0223253 A1    Oct. 5, 2006

(30) Foreign Application Priority Data
Apr. 5, 2005    (JP) .............................. 2005-108978

(51) Int. Cl.
  *H01L 29/207* (2006.01)
  *H01L 29/227* (2006.01)
(52) U.S. Cl. ..................................... 257/611
(58) Field of Classification Search ................. 438/246, 438/302, 389, 525; 257/285, 611
See application file for complete search history.

(56) References Cited

U.S. PATENT DOCUMENTS

| 5,502,320 A * | 3/1996 | Yamada ....................... 257/302 |
| 2004/0183136 A1* | 9/2004 | Williams et al. ............ 257/369 |

* cited by examiner

*Primary Examiner*—Calvin Lee
(74) *Attorney, Agent, or Firm*—Adams & Wilks

(57) ABSTRACT

A semiconductor device has a semiconductor substrate and a high-resistance first conductivity type well region disposed on the semiconductor substrate. A low-resistance second conductivity type source region and a low-resistance second conductivity type drain region are formed in the well region. The well region is formed with trenches having convex and concave portions and that are disposed parallel to a source-drain direction of the source and drain regions. A gate insulating film is disposed on surfaces of the convex and concave portions of the trenches. A gate electrode is disposed on the gate insulating film.

20 Claims, 16 Drawing Sheets

SEMICONDUCTOR DEVICE AND METHOD OF MANUFACTURING THE SAME

BACKGROUND OF THE INVENTION

1. Field of the Invention

The present invention relates to a semiconductor device for which high driving performance is required.

2. Description of the Related Art

Year by year full use of fine processing technology has enabled manufacturing of small semiconductor devices without lowering capability. This trend can also apply to a semiconductor element having high driving performance. The reduction of an ON resistance of the element per unit area has been achieved with the best use of fine processing technology. However, it is also a fact that lowering of withstanding voltage, which is caused by miniaturization of elements, hinders further improvement of the driving performance. Elements with various structures have been proposed in order to eliminate the trade-off between miniaturization and withstanding voltage. A trench gate MOS transistor is an example in a power MOS FET with a high withstanding voltage and high driving performance, which constitutes present mainstream. The trench gate MOS transistor has the highest packing density in integration among DMOS transistors having high withstanding voltage and high driving performance. The trench gate MOS transistor has, however, a longitudinal MOS structure in which current flows in a depth direction of a substrate. The transistor has extremely excellent performance as an element itself, but has a disadvantage when mounted on a chip with other IC elements. When mounting on a chip with other ICs is taken into consideration, a conventional lateral MOS structure can never be skipped.

A lateral trench gate transistor has been proposed as a method capable of reducing ON resistance per unit area without lowering withstanding voltage. In this transistor, a gate portion has a structure having a convex portion and a concave portion to gain a larger gate width (for example, refer to JP 3405681 B). FIGS. 4A to 4D are conceptual diagrams for the conventional art. Here, FIG. 4A is a plan view, FIG. 4B is a sectional view taken along the line 4B-4B' in FIG. 4A, FIG. 4C is a sectional view taken along the line 4C-4C' in FIG. 4A, and FIG. 4D is a sectional view taken along the line 4D-4D' in FIG. 4A. Here, for convenience in viewing FIG. 4A, a gate electrode 003 and a gate insulating film 004 outside trenches are shown transparently. A bold line indicates an edge of the gate electrode 003. This art discloses the extension of a gate width per unit area of a lateral MOS transistor and the resultant reduction in ON resistance thereof with the gate portion 003 having a trench structure.

The above-mentioned art has, however, two problems.

(1) The first problem will be explained. FIG. 5 is a bird's-eye view obtained by taking out only a source region 001 or a drain region 002 shown in FIGS. 4A to 4D. Here, the gate oxide film 004 and the gate electrode 003 are not shown. In FIG. 5, the surface of the source region 001 or the drain region 002, which is dark-colored, and which contacts with a trench wall, is a portion 020 that contacts with a channel portion. The portion 020 that contacts with the channel portion exists on each of all the surfaces of the source region 001 or drain region 002, which contact with the trench wall. That is, in the structures of FIGS. 4A to 4D, dimensions of lengths d1, w1, and l2 determine a contact area between the source region 001 or drain region 002 and the channel portion. When the contact area is small, this area becomes a bottleneck as shown by a current flow 019 shown in FIG. 4D (a current density becomes dense in the source region and the drain region), which inhibits the reduction of the ON resistance. In order to increase the contact area it is sufficient to make the dimensions of lengths of the $d_1$, $w_1$, and $l_2$ larger.

First, the length $d_1$ is considered. The length $d_1$, which corresponds to the depth of each of the source region 001 and the drain region 002 in the case where each of the source region 001 and the drain region 002 is formed through normal ion implantation, is generally shallow, several thousands Å, and there is a limit to its depth.

When the width of the convex portion of the trench is kept constant, a longer length for $w_1$, which corresponds to the width of the concave portion of the trench, causes decrease in the number of trenches per unit area and decrease in the vertical contact area, resulting in decrease in the gate width. Enlargement of the length $w_1$ is thus impossible.

As regards a method of lengthening the $l_2$ as an overlap length between the source region 001 or the drain region 002 and the trench, it is clear that in the case where $l_2$ is lengthened without changing the gate length, the area increases accordingly. Further, when it is supposed that the source region 001 and the drain region 002 are formed in self-alignment manner with the gate electrode 003, in order to lengthen $l_2$, a method of shortening $l_1$ or a method of increasing the length over which impurities of the source region 001 and the drain region 002 are diffused is considered; since there is limitation in shortening $l_1$, the method of lengthening $l_2$ through the diffusion of the impurities should be taken. However, this method also has limitation on the length, and additionally has a risk such as the reduction in concentration of the source region 001 or the drain region 002 caused by the excessive impurity diffusion. Actual implementation of the method is, therefore, difficult. That is, it is difficult to increase the contact area in the conventional art without changing the element area to reduce the ON resistance of the MOS transistor.

(2) The second problem is that there is a limitation to the trench depth. Increasing the trench depth can further increase the gate width per unit area. However, this only applies to the case in a well region 005. There is a limitation to the depth of the well region 005 formed by a general method. Thus, the trench cannot be deeper than the well region 005. If the trench is made deeper than the well region 005, a current leaks to the substrate.

SUMMARY OF THE INVENTION

The present invention has been made to solve the above-mentioned two problems, and therefore provides a lateral MOS transistor with high driving performance. The lateral MOS transistor with high driving performance includes a gate electrode formed in trenches whose lengthwise direction is parallel to a gate length direction (i.e., a source-drain direction), and which has a long gate width per unit area. The lateral MOS transistor of the present invention attains a low ON resistance and a high driving performance without increasing a planar element area.

(1) A semiconductor device has a structure in which: a well region of a high resistance p-type semiconductor is disposed in a given depth from a surface of an n-type or p-type semiconductor substrate; a plurality of trenches extend from the surface of the well region to a certain depth; a gate insulating film is formed on a surface of a convexo-concave portion on which the trenches are formed; a gate electrode is embedded into the trenches, and includes a gate electrode film that is disposed on a substrate surface in contact with the gate electrode embedded into the trenches in the convexo-concave portion region except for a portion in a vicinity of both ends of the trenches; and a source region and a drain region that are two low resistance n-type semiconductor layers which are disposed shallower than the depth of the well region in the well region except for a lower portion of the gate electrode film.

(2) A method of manufacturing the semiconductor device includes: forming the trench regions; and forming the well region by oblique ion implantation in multiple directions.

(8) A method of manufacturing the semiconductor device includes the step of forming the well region, the step of forming the well region including: forming a p-type semiconductor region through ion implantation on the surface of the semiconductor substrate; forming a semiconductor on the surface of the semiconductor substrate through epitaxial growth; and forming a p-type semiconductor region through ion implantation on a surface of the semiconductor formed through epitaxial growth.

According to the present invention, because portions in a vicinity of both ends of the trench become the source and drain regions, increase in the contact areas between the source and drain regions and the channel region enables reduction in the ON resistance.

According to the present invention, the well region is formed with the oblique ion implantation in multiple directions immediately after the trench formation. The well region is thus formed deeper than the bottom surface of the concave portion. The trench can therefore be formed deeper compared with the method in which the well region is formed before the trench formation. Accordingly, a larger gate width per unit area can be obtained.

Further, according to the present invention, connection through thermal diffusion of the second conductivity type semiconductor region formed between the semiconductor substrate surface and the epitaxial film through the ion implantation with the second conductivity type semiconductor region formed through the oblique ion implantation after formation of the trench structure to the epitaxial. Thus, the well can be formed even deeper. Accordingly, the bottom surface of the concave portion can be formed even deeper, and consequently, the gate width per unit plane can be further increased.

DETAILED DESCRIPTION OF THE PREFERRED EMBODIMENT

Embodiment

Figure 1A:
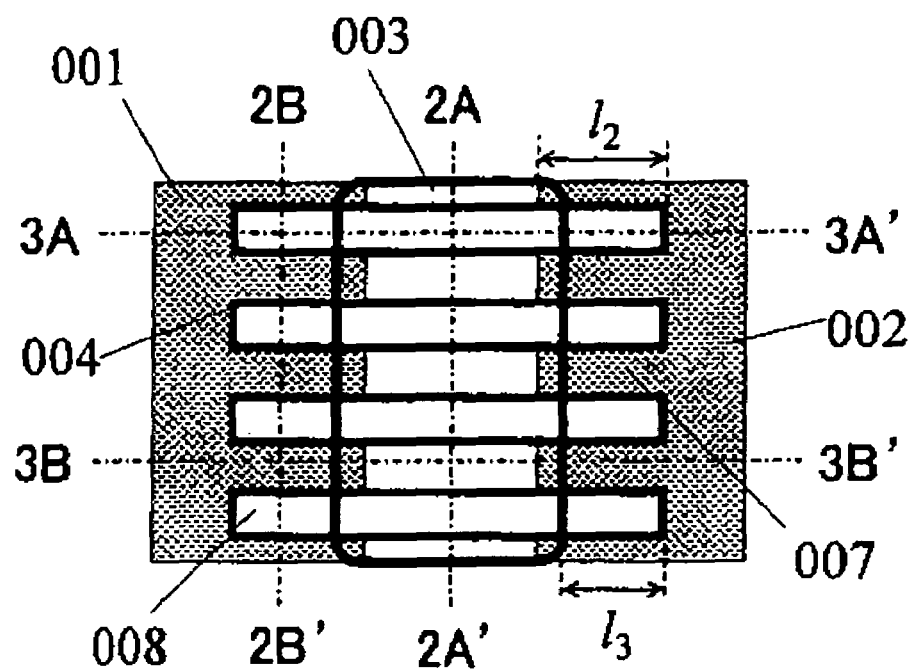
FIG. 1A is a plan view showing a basic structure of the present invention.
Figure 1B:
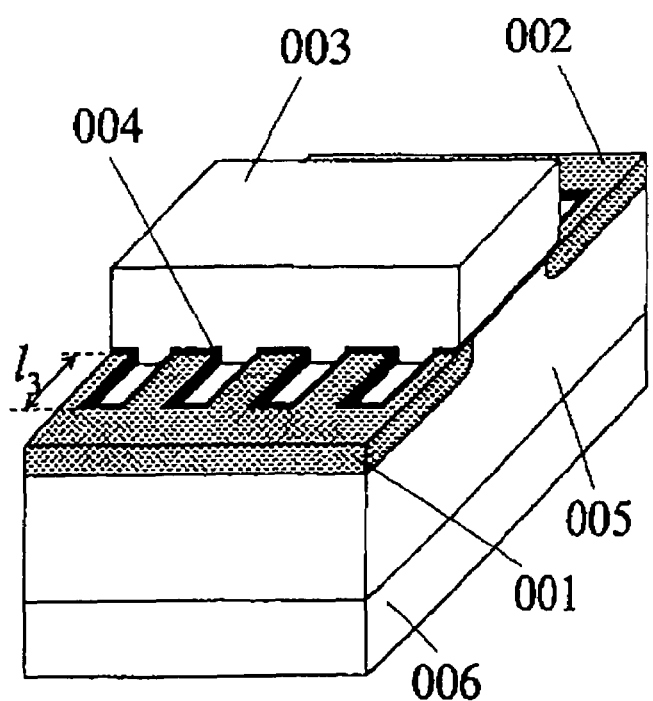
FIG. 1B is a bird's-eye view showing the basic structure of the present invention.
Figure 2A:
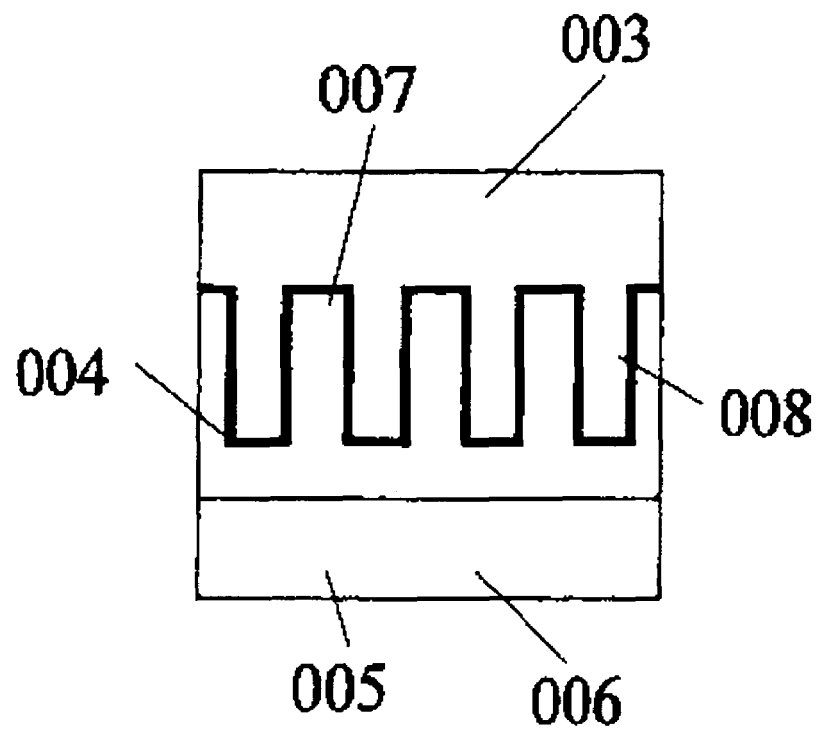
FIG. 2A is a cross sectional view taken along the line 2A-2A' of FIG. 1A.
Figure 2B:
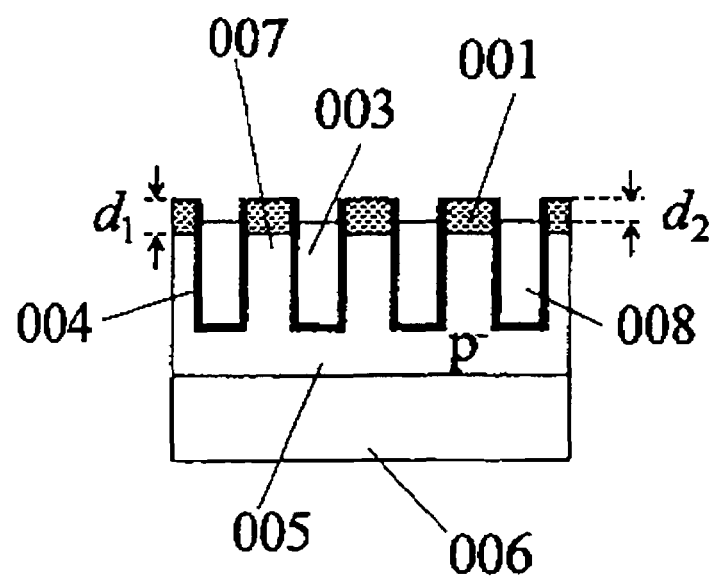
FIG. 2B is a cross sectional view taken along the line 2B-2B' of FIG. 1A.
Figure 3A:
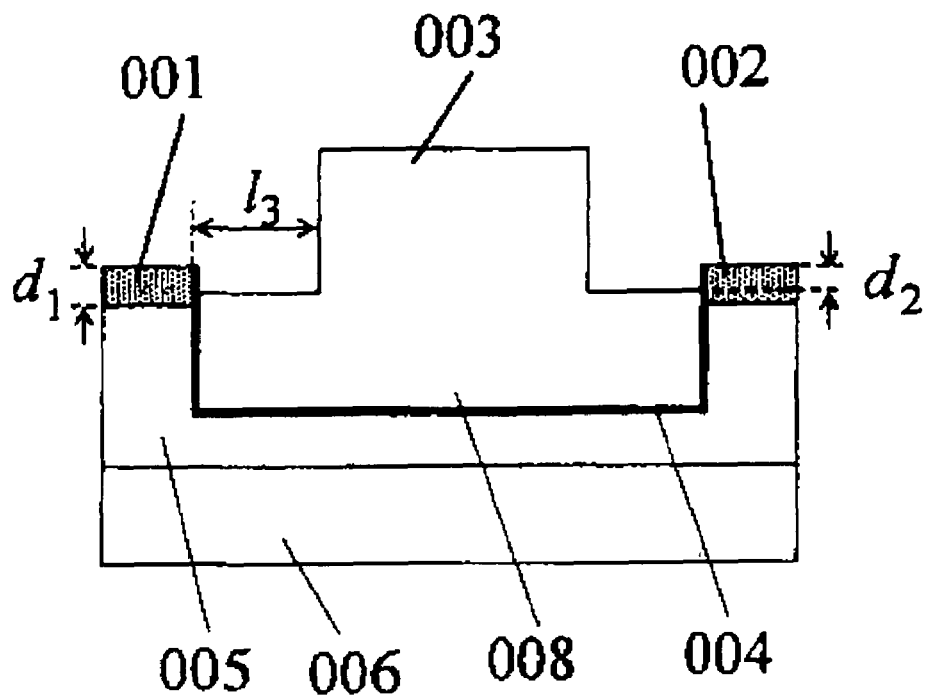
FIG. 3A is a cross sectional view taken along the line 3A-3A' of FIG. 1A.
Figure 3B:
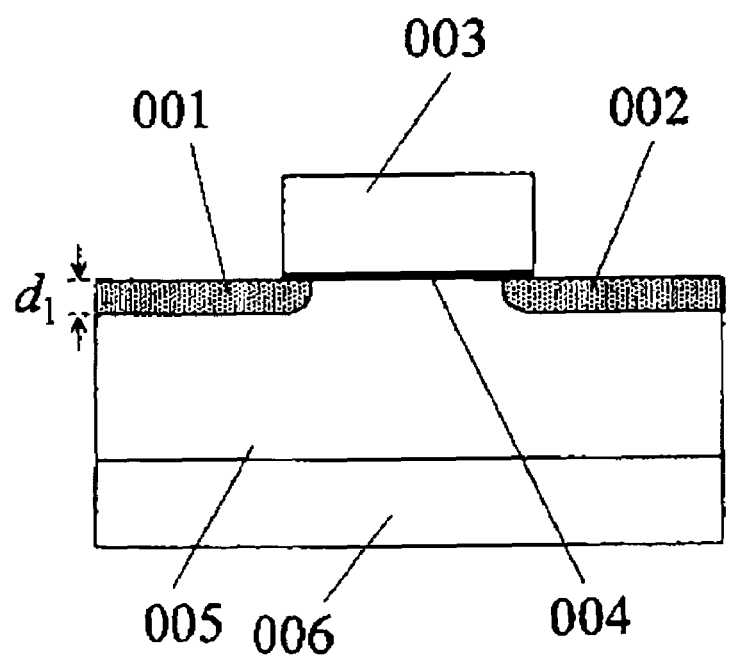
FIG. 3B is a cross sectional view taken along the line 3B-3B' of FIG. 1A.
Figure 4A:
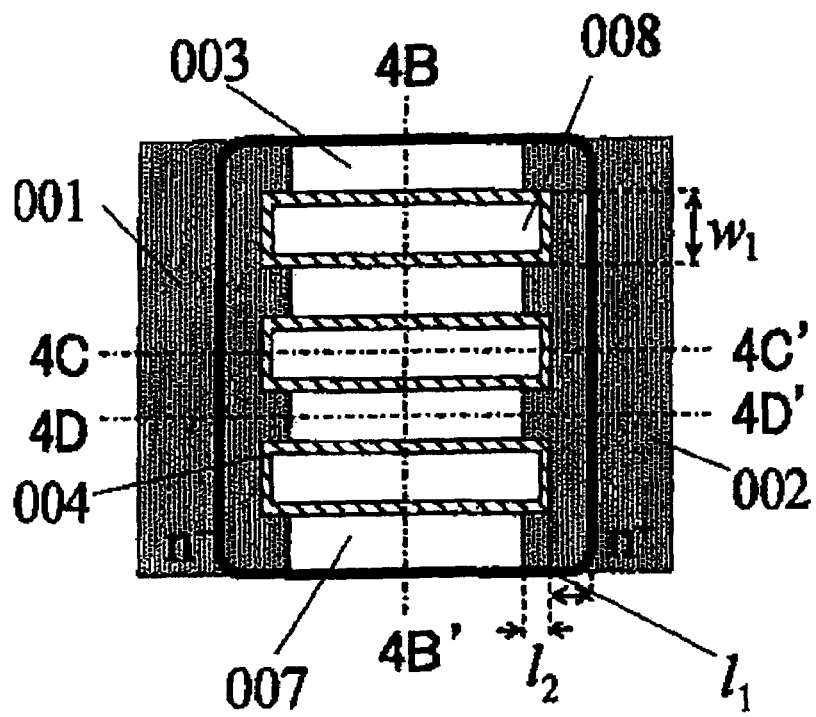
FIG. 4A is a plan view showing an embodiment of the conventional art.
Figure 4B:
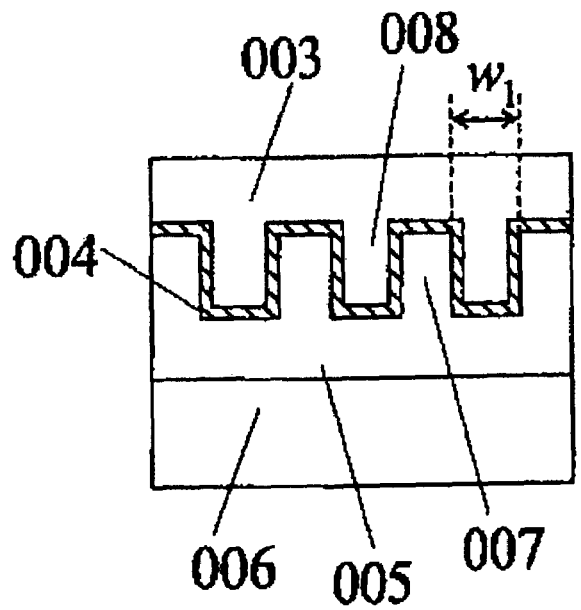
FIG. 4B is a cross sectional view showing the embodiment of the conventional art taken along the line 4B-4B' of FIG. 4A.
Figure 4C:
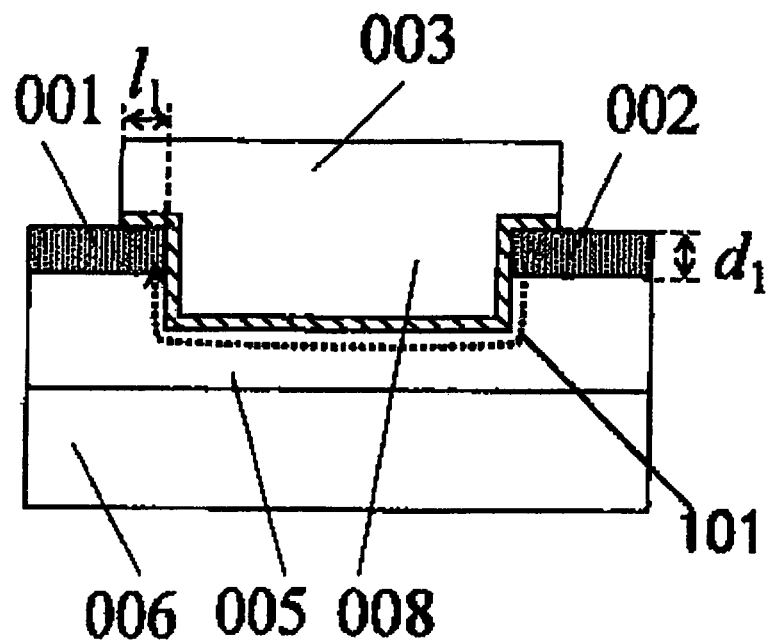
FIG. 4C is a cross sectional view showing the embodiment of the conventional art taken along the line 4C-4C' of FIG. 4A.
Figure 4D:
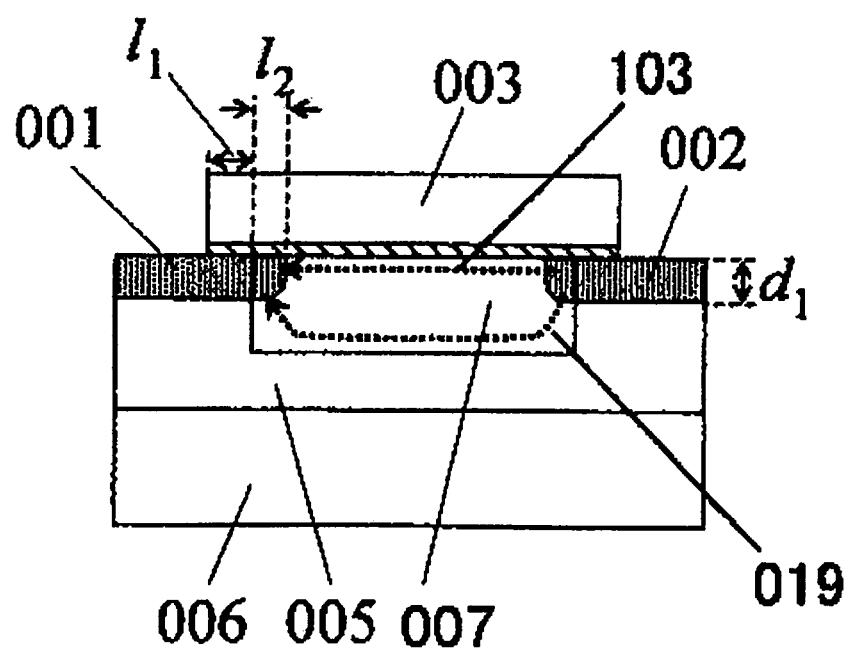
FIG. 4D is a cross sectional view showing the embodiment of the conventional art taken along the line 4D-4D' of FIG. 4A.

FIGS. 1A and 1B each show a representative embodiment of the present invention. FIG. 1A is a plan view of the invention, and FIG. 1B is a bird's-eye view of FIG. 1A. Referring to FIG. 1A, for convenience in viewing, a gate electrode 003 and a gate insulating film 004 outside of trenches are made transparent. A bold line indicates an edge of the gate electrode 003. Also, FIG. 2A is a cross sectional view taken along the line 2A-2A' of FIG. 1A, FIG. 2B is a cross sectional view taken along the line 2B-2B' of FIG. 1A, FIG. 3A is a cross sectional view taken along the line 3A-3A' of FIG. 1A, and FIG. 3B is a cross sectional view taken along the line 3B-3B' of FIG. 1A. In the conventional example shown in FIG. 4, the gate electrode 003 covers an entire trench portion. On the contrary, in the present invention shown in FIGS. 1 to 3, portions in a vicinity of both ends of the trench are not covered with the gate electrode 003. In this structure, a longer $l_3$ (a longer $l_2$) can give a larger contact area of the source and drain regions with the channel region, which solves the aforementioned first object.

Figure 6A:
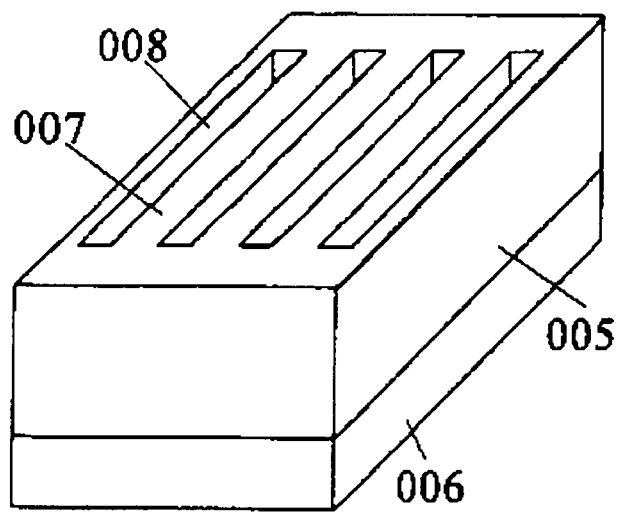
FIG. 6 is a bird's-eye view showing a manufacturing process according to the present invention.
Figure 6B:
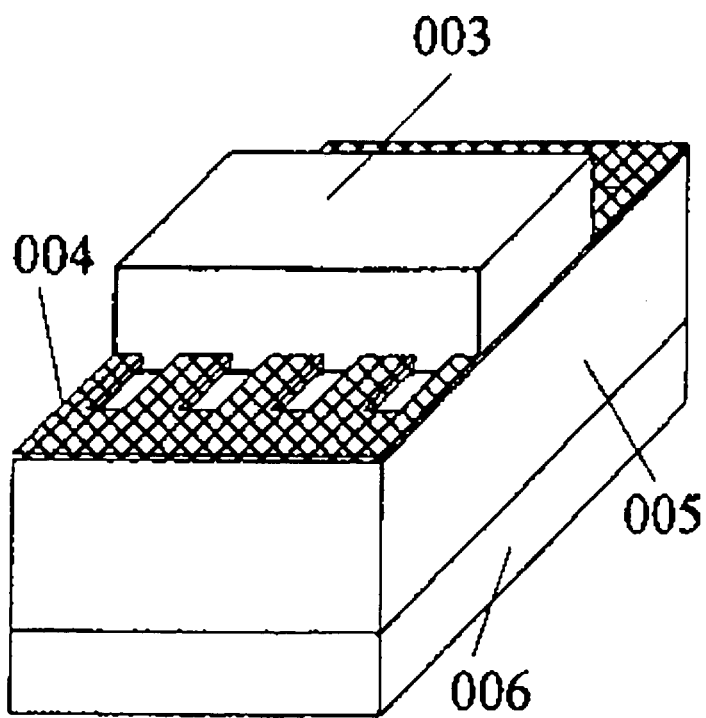
Figure 6C:
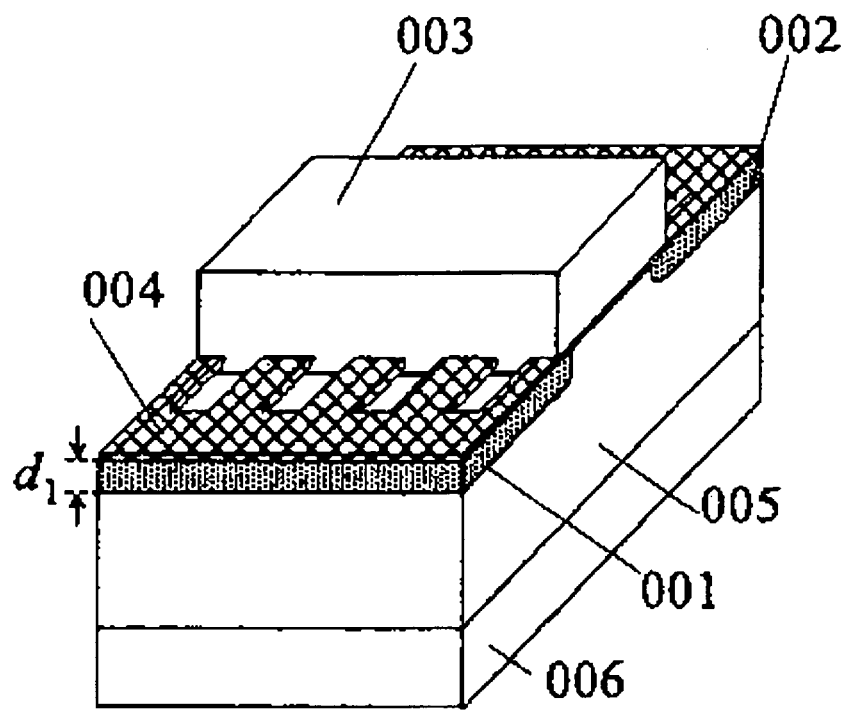
Figure 10A:
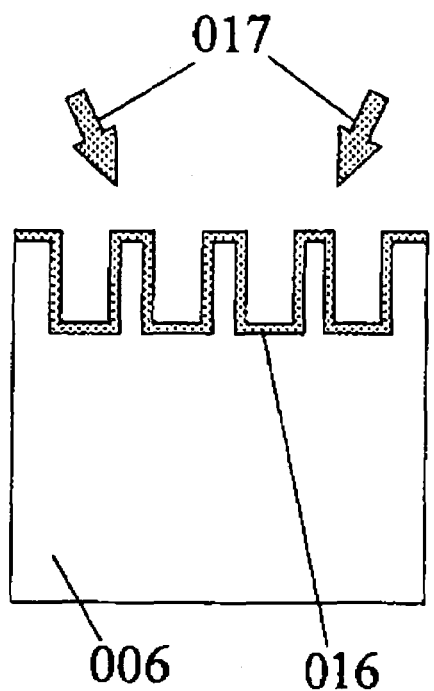
FIG. 10A is a cross sectional view showing a structure in which a trench depth is relatively shallow, immediately after oblique ion implantation from multiple directions.
Figure 10B:
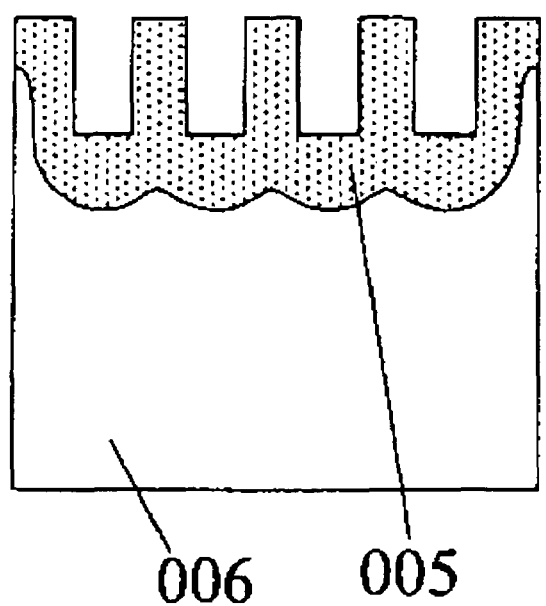
FIG. 10B is a cross sectional view showing a structure in which a trench depth is relatively shallow, in a case where ions are thermally diffused after oblique ion implantation from multiple directions.

Next, the manufacturing method will be described. FIGS. 6A to 6C each show an example of the manufacturing method according to the present invention. As shown in FIG. 6A, a plurality of trenches are formed on a high resistance n-type or p-type semiconductor substrate 006 in which a well region 005 is formed in a vicinity of a surface thereof. In this example, it is difficult to obtain deep trenches since a deep trench requiring its trench depth being deeper than the depth of the well region 005 causes leak current flow in the substrate. However, it is possible to further increase the trench depth when the ion implantation for forming the well region 005 is conducted by the oblique ion implantation from the multiple directions immediately after formation of the trench region as shown in FIG. 10A. This is because ions are implanted into the side surfaces and the upper surface of the trench by the right and left oblique ion implantation 017, ions are implanted into the upper surface and the bottom surface of the trench by the oblique ion implantations from the front and back, which are not shown, and the depth of the well region is so formed as to be increased further than the trench bottom portion by the subsequent thermal diffusion as shown in FIG. 10B. In the above method, the trench depth can be surely increased further than that formed by the method of forming the trench region after forming the well region 005. As a result, a larger gate width per a unit area can be obtained, and the aforementioned second object can be eliminated.

Figure 11A:
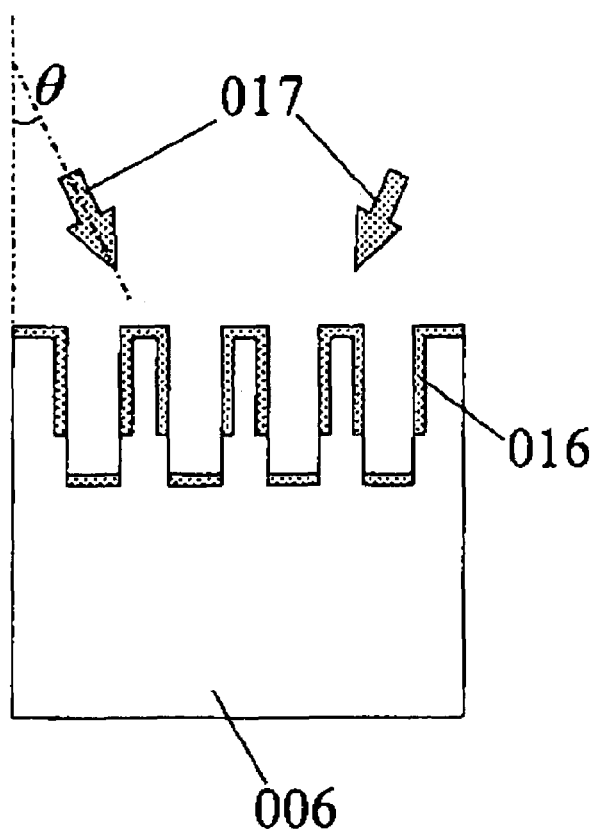
FIG. 11A is a cross sectional view showing a structure in which the trench depth is deeper and an ion implementation angle θ is larger, immediately after oblique ion implantation from multiple directions.
Figure 11B:
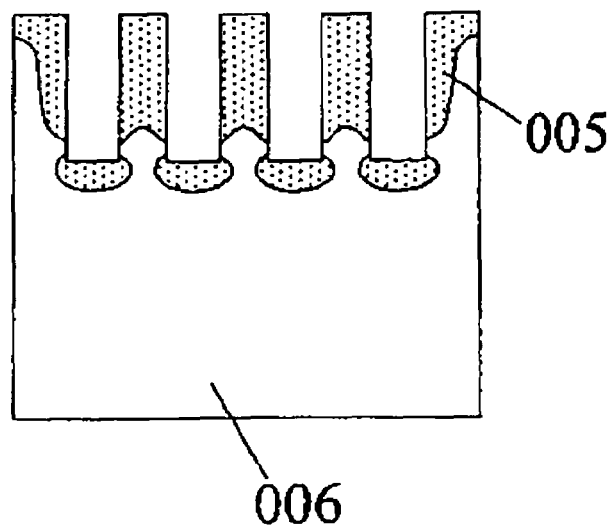
FIG. 11B is a cross sectional view showing a structure in which the trench depth is deeper and an ion implementation angle θ is larger, in a case where ions are thermally diffused after oblique ion implantation from multiple directions.
Figure 12:
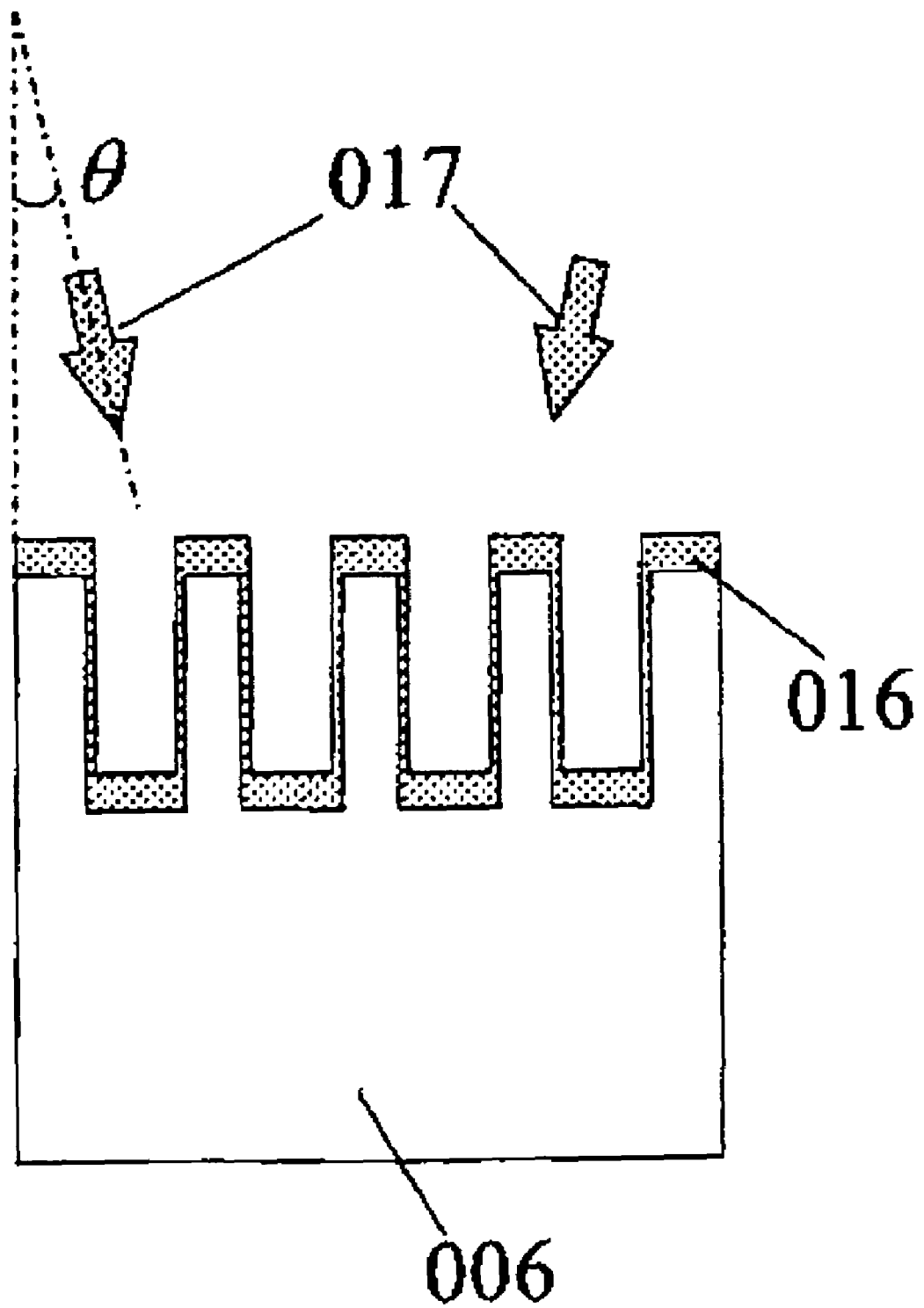
FIG. 12 is a cross sectional view showing a structure in which the trench depth is deeper and an ion implementation angle θ is smaller.

Even in the above method there exists a limitation on a trench depth. Simple increase in the trench depth without changing an angle θ in the oblique ion implantation develops a region to which ions are not implanted in the side surface of the trench bottom portion, as shown in FIG. 11A, causing insufficient surrounding of the well region 005 around the trenches even after thermal diffusion, as shown in FIG. 11B. On the other hand, a smaller angle θ in the oblique ion implantation in order that ions are implanted to the trench side surface of the trench bottom portion yields insufficient ion implantation to the trench side surfaces, as shown in FIG. 12, resulting in non-uniform ion concentration profile of the well after thermal diffusion.

Figure 13A:
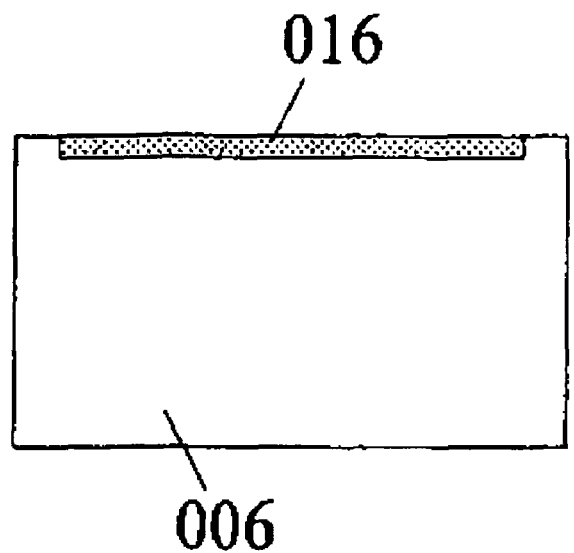
FIG. 13A is a cross sectional view showing a structure in which ions are implanted into a semiconductor substrate surface in a method of producing a well through epitaxial growth and oblique ion implantation.
Figure 13B:
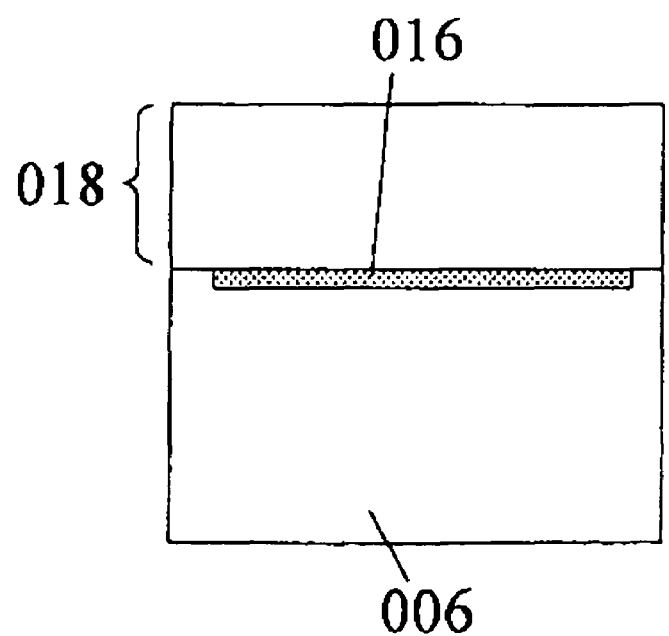
FIG. 13B is a cross sectional view showing a structure in which a semiconductor film is formed on a substrate surface of FIG. 13A with epitaxial growth in a method of producing a well through epitaxial growth and oblique ion implantation.
Figure 13C:
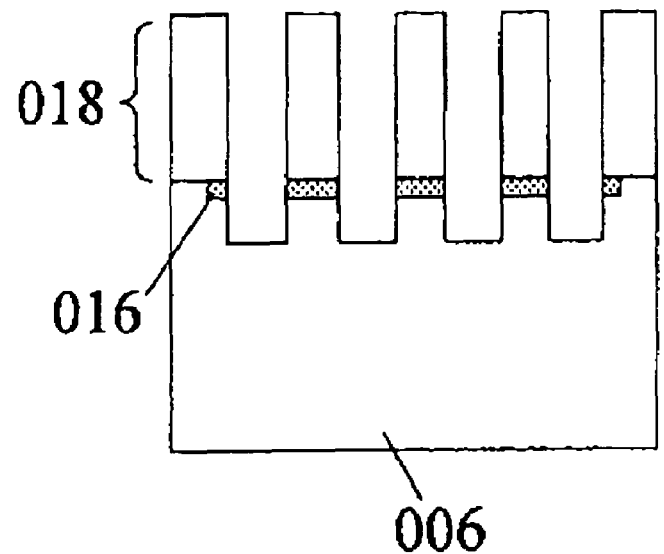
FIG. 13C is a cross sectional view showing a structure in which a trench structure is formed in FIG. 13B in a method of producing a well through epitaxial growth and oblique ion implantation.
Figure 13D:
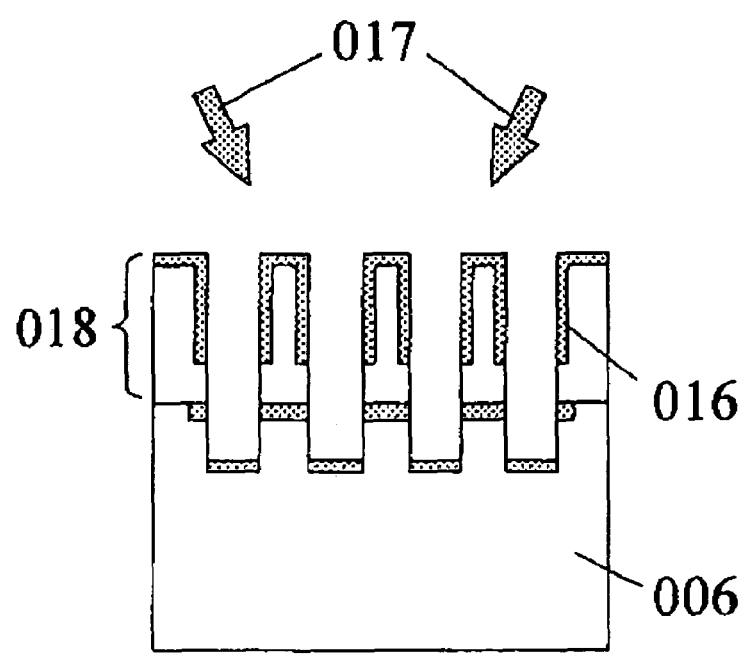
FIG. 13D is a cross sectional view showing a structure in which ions are implanted obliquely in multiple directions in FIG. 13C in a method of producing a well through epitaxial growth and oblique ion implantation.
Figure 13E:
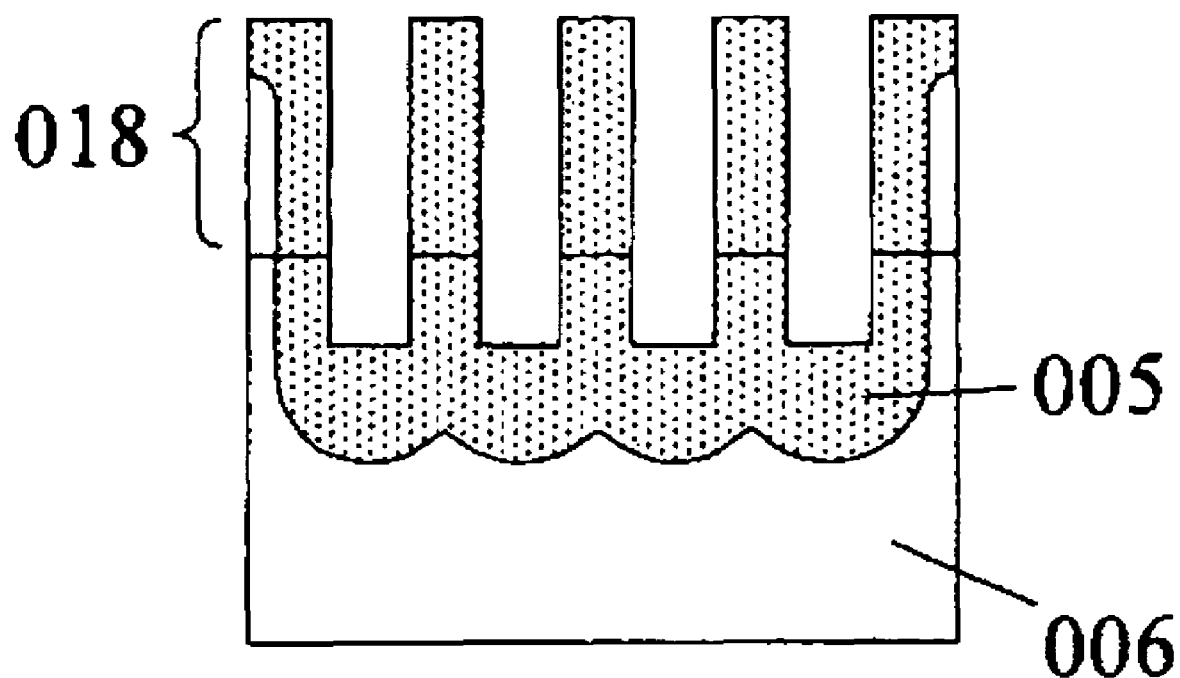
FIG. 13E is a cross sectional view showing a structure after thermal diffusion is conducted in FIG. 13D in a method of producing a well through epitaxial growth and oblique ion implantation.

However, the trench depth can be increased to exceed the limitation by combining the oblique ion implantation with an epitaxial growth. As shown in FIG. 13A, a region 016, which is subjected to ion implantation in order to have the same conductivity type, is formed on the surface of the semiconductor substrate 006. Then, as shown in FIG. 13B, a semiconductor film is deposited through epitaxial growth. Thereafter, a trench structure is formed as shown in FIG. 13C, and oblique ion implantation in multiple directions is performed as shown in FIG. 13D. Since an ion implantation layer exists between the epitaxial layer and the semiconductor substrate, the well surrounding all the trenches can be formed through thermal diffusion as shown in FIG. 13E. With this method, the trench width can be further increased, and thus, an even larger gate width per unit area can be obtained.

Figure 5:
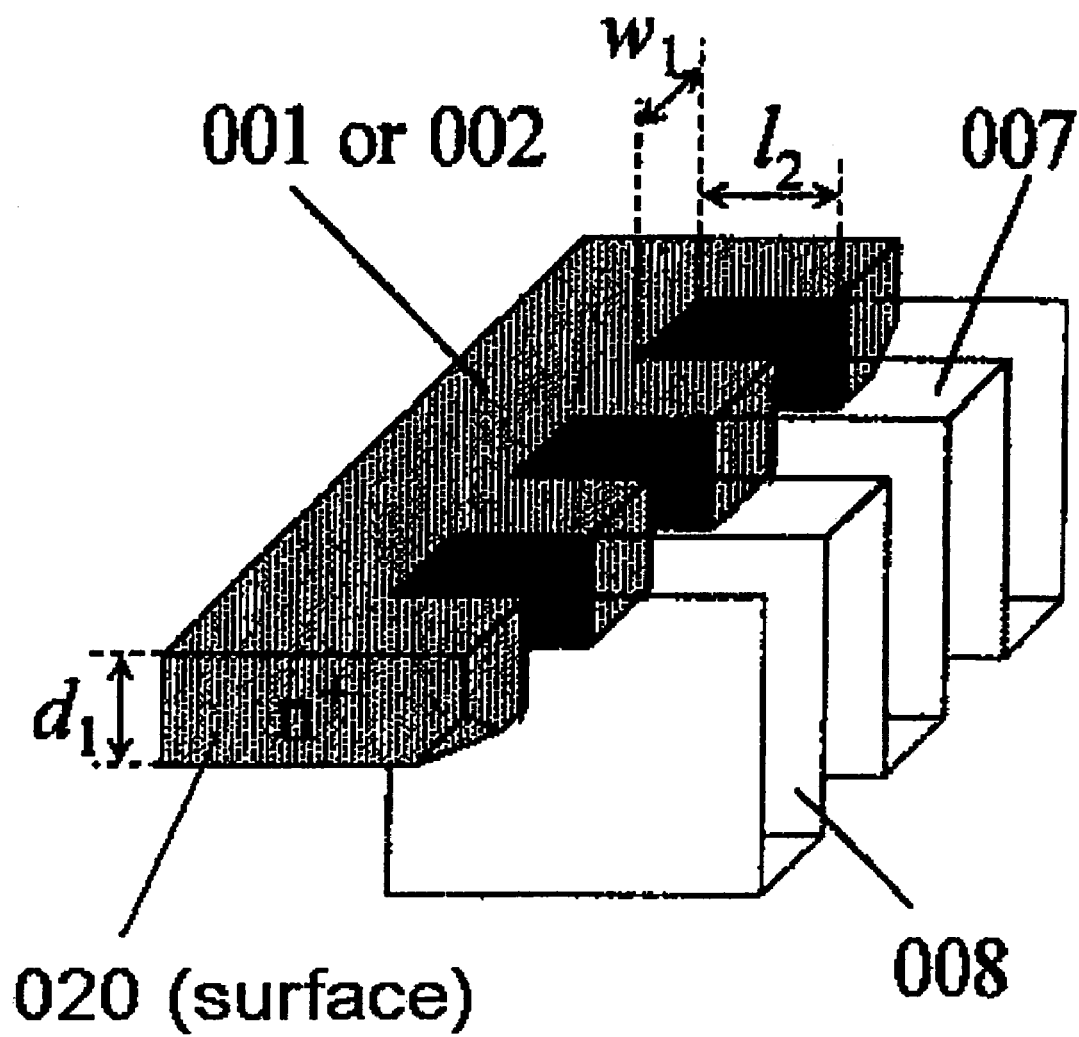
FIG. 5 is a bird's-eye view showing a source region or a drain region shown in FIG. 4, in which a dark portion represents a channel.

Then, as shown in FIG. 6B, the substrate surface is oxidized to sequentially form the gate insulating film 004 and the gate electrode film 003, and the gate electrode film 003 is etched except the gate electrode film 003 on the region which becomes the channel. At this time, the gate electrode 003 on the upper portions of both ends of the trench of the length $l_3$ is also etch packed to the degree that the ON resistance reduction is not impeded by a reduction in the contact areas of the source and drain regions with the channel shown in FIG. 5, and embedded into the trench so that the thickness of gate electrode 003 satisfies $d_2>0$.

Figure 7:
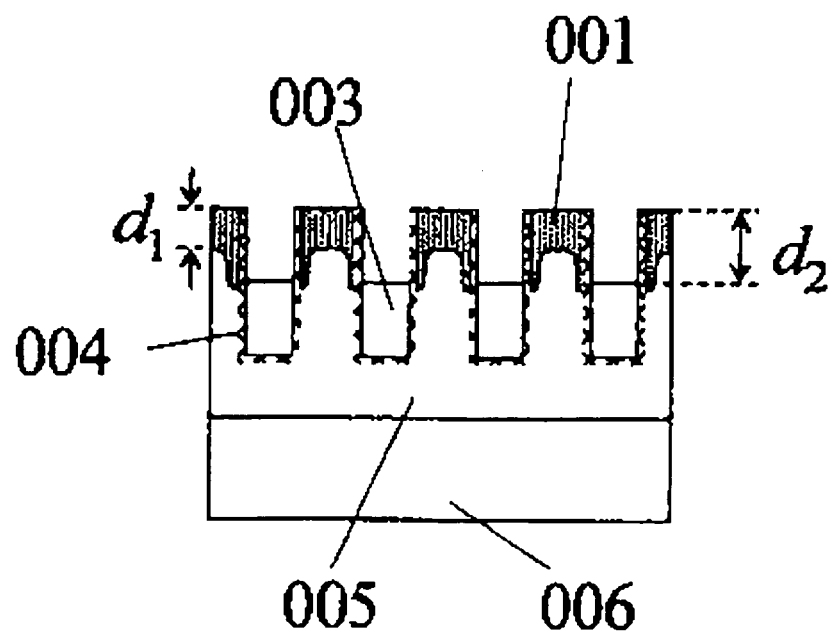
FIG. 7 is a cross sectional view taken along the line 2B-2B' of FIG. 1A in a case of $d_1 < d_2$.

Subsequently, as shown in FIG. 6C, the source region 001 and the drain region 002 are formed by the ion implantation and the impurity diffusion. In a case where $d_1<d_2$ holds and the source region 001 and the drain region 002 are apart from the channel portion, the source and drain regions may be formed by the oblique ion implantations as shown in FIG. 7. In this example, FIG. 7 is a cross sectional view taken along the line 2B-2B' of FIG. 1A. Finally, a passivation film is formed on a structure surface shown in FIG. 6C, contact holes are defined in the source, gate, and drain portions, and takes out the respective electrodes to complete the process. In the above embodiment, it is needless to say that a p-channel MOS structure can also be produced in the same manner by reversing the conductive type. Also, the use of a twin well technology enables production of a CMOS structure having high driving performance in one chip and fabrication of mixed IC. The above description is given to the basic structure and the basic manufacturing method according to the present invention.

Now, a description will be given to the application of the basic structure.

Figure 8:
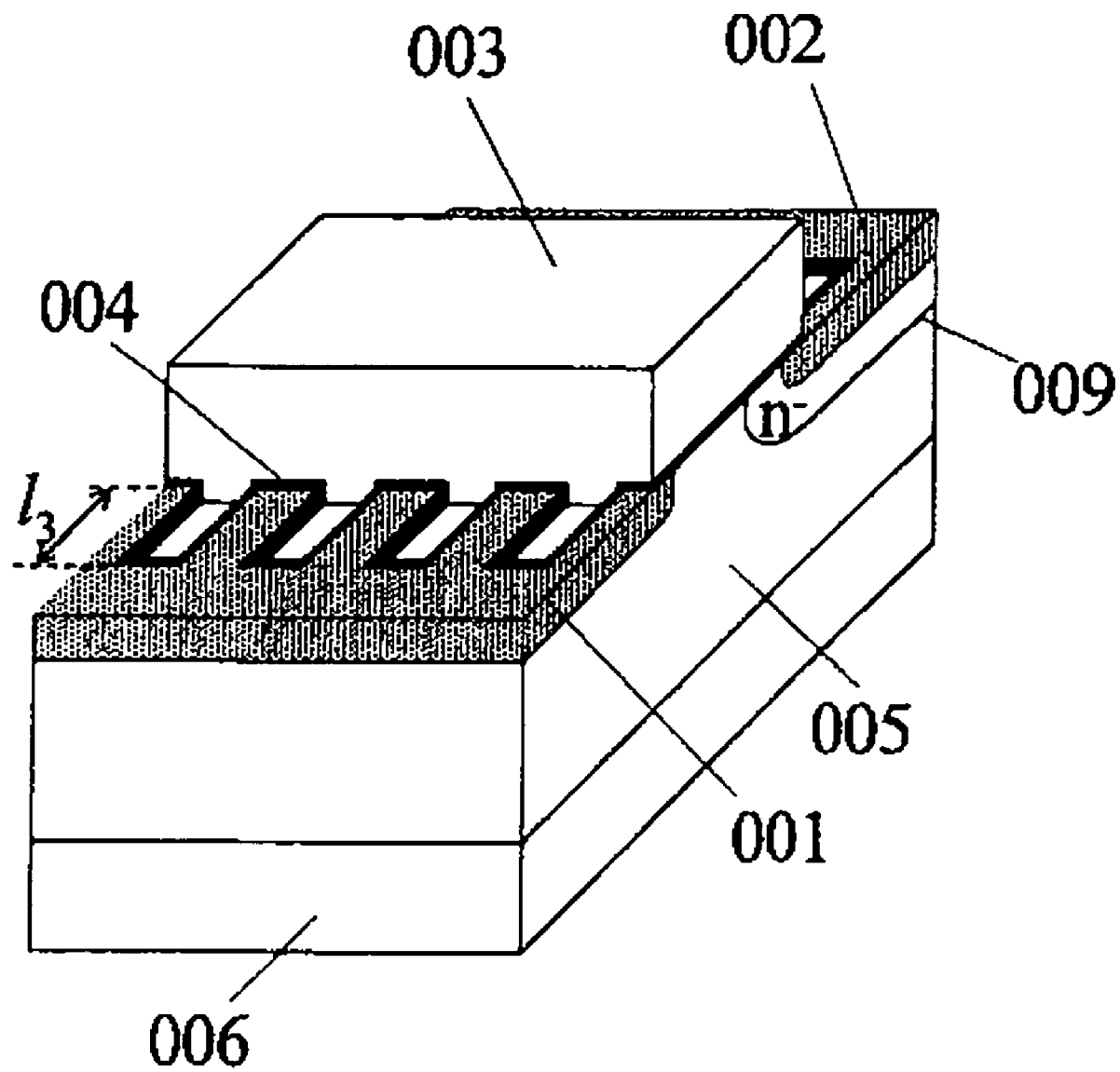
FIG. 8 is a bird's-eye view showing a DDD structure according to the present invention.
Figure 9:
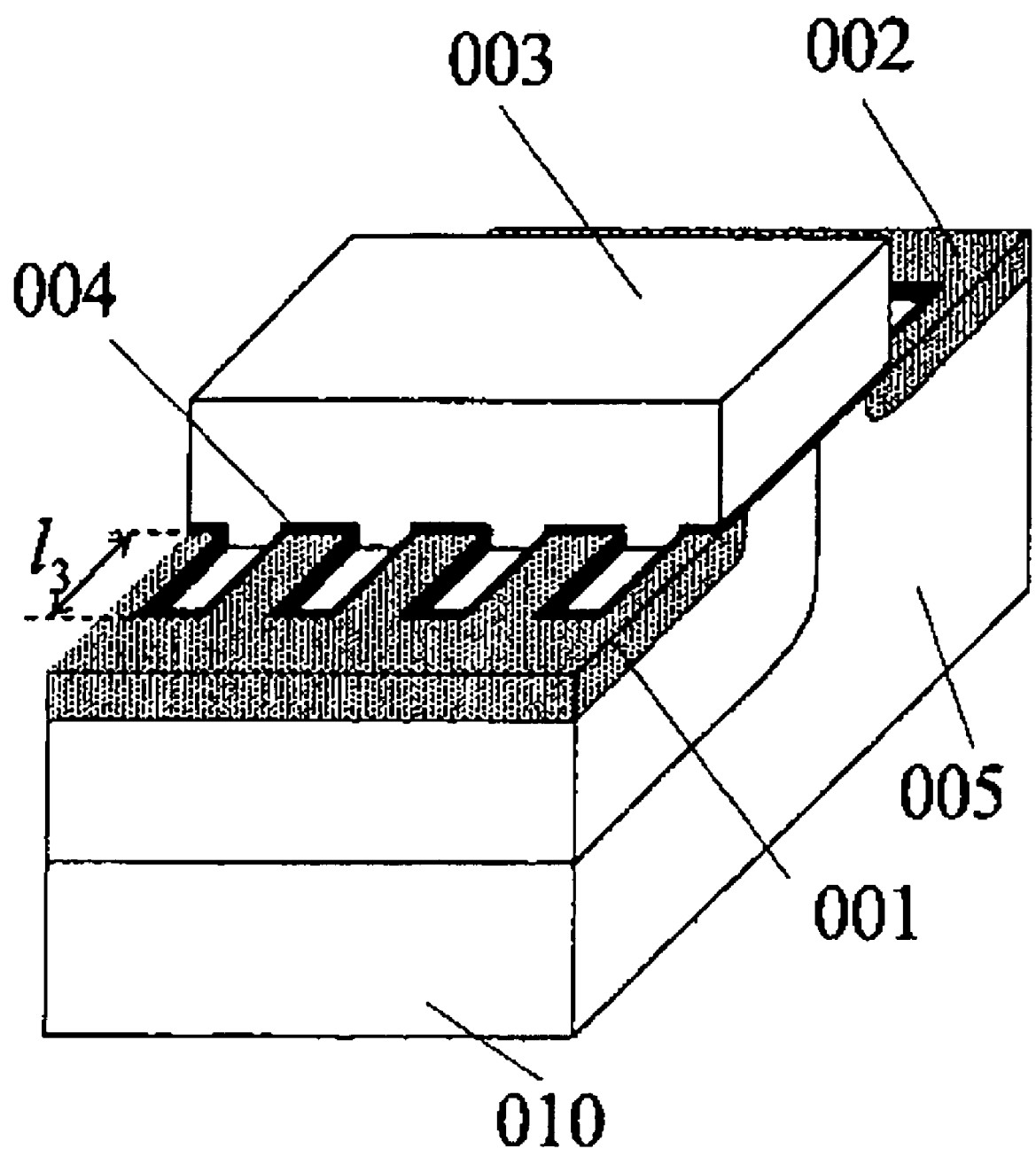
FIG. 9 is a bird's-eye view showing an LDMOS structure according to the present invention.

In ordinary planar MOS transistors various structures exist aiming to improve the withstanding voltage based on a basic structure. In the present invention, an improvement of withstanding voltage can be attained easily by combining conventional art of the DDD (double diffused drain) structure as shown in FIG. 8, or the LDMOS (lateral double diffused MOS) structure as shown in FIG. 9, or the like to the basic construction (FIG. 1).

Also, the width of the concave portion 007 shown in FIG. 1 is about 1,000 Å whereby the inner part of the concave portion is fully depleted when the MOS transistor is in the ON state, and the sub-threshold characteristic is improved. Accordingly, leak current between the source and the drain is reduced, the threshold voltage can be lowered, and the driving performance can be resultantly further improved.

The embodiment of the present invention has been described, but the present invention is not limited to the above embodiment and can be modified to implement within a range that does not depart from the gist of the invention.

What is claimed is:

1. A semiconductor device comprising:
   a semiconductor substrate;
   a high-resistance first conductivity type well region disposed on the semiconductor substrate;
   a low-resistance second conductivity type source region and a low-resistance second conductivity type drain region formed in the well region;
   a plurality of trenches formed in the well region and disposed parallel to a source-drain direction of the source and drain regions, the trenches having convex and concave portions;
   a gate insulating film disposed on surfaces of the convex and concave portions of the trenches; and
   a gate electrode disposed on the gate insulating film.

2. A semiconductor device according to claim 1; wherein the source region and the drain region are formed in the vicinity of portions of the trenches at opposite ends thereof.

3. A semiconductor device according to claim 1; wherein the gate electrode extends across the convex and concave portions of the trenches.

4. A semiconductor device comprising:
a semiconductor substrate;
a well region disposed on the semiconductor substrate;
a source region and a drain region formed in the well region;
a plurality of trenches formed in the well region and disposed parallel to a source-drain direction corresponding to the source region and the drain region;
a gate insulating film disposed on surfaces of the trenches; and
a gate electrode film disposed over the semiconductor substrate, the gate electrode film having a portion extending into the trenches and a surface portion disposed outside of the trenches and extending in a direction away from the semiconductor substrate.

5. A semiconductor device according to claim 4; wherein the well region comprises a high-resistance first conductivity type well region; and wherein the source and drain regions comprise low-resistance second conductivity type source and drain regions.

6. A semiconductor device according to claim 4; wherein the well region has a first surface disposed on the semiconductor substrate and a second surface opposite to the first surface; and wherein the trenches extend only up to a central portion of the well region from the second surface thereof.

7. A semiconductor device according to claim 4; wherein the trenches form a plurality of convex and concave portions; and wherein the gate insulating film is disposed on surfaces of the concave and convex portions of the trenches.

8. A semiconductor device according to claim 4; wherein the trenches form a plurality of convex and concave portions; and wherein the gate electrode film extends at least partly across the convex and concave portions of the trenches.

9. A semiconductor device according to claim 4; wherein the trenches extend between the source region and the drain region.

10. A semiconductor device according to claim 4; wherein the semiconductor device has a double diffusion drain (DDD) structure.

11. A semiconductor device according to claim 4; wherein the semiconductor device has a lateral double diffused MOS (LDMOS) structure.

12. A semiconductor device according to claim 4; wherein the trenches form a plurality of convex and concave portions, each of the convex portions having a width of approximately 1,000 Å.

13. A semiconductor device according to claim 4; wherein the semiconductor device has a twin-well construction.

14. A semiconductor device comprising:
a semiconductor substrate;
a well region having a first conductivity type of high resistance and disposed at a given preselected depth from a surface of the semiconductor substrate;
a plurality of trenches forming a plurality of convex and concave portions, each of the trenches extending from a surface of the well region to approximately a center of the preselected depth;
a gate insulating film disposed on surfaces of the convex and concave portions of the plurality of trenches;
a gate electrode film having a portion embedded into the plurality of trenches and a surface portion disposed on the semiconductor substrate, the gate electrode film extending across the convex and concave portions of the plurality of trenches except for a portion of the gate electrode film in a vicinity of opposite ends of the plurality of trenches; and
a source region and a drain region each having a second conductivity of low resistance and being disposed in the well region, the plurality of trenches extending parallel to a source-drain direction.

15. A semiconductor device according to claim 14; wherein the semiconductor device has a double diffusion drain (DDD) structure.

16. A semiconductor device according to claim 14; wherein the semiconductor device has a lateral double diffused MOS (LDMOS) structure.

17. A semiconductor device according to claim 14; wherein each of the convex portions of the plurality of trenches has a width of approximately 1,000 Å.

18. A semiconductor device according to claim 14; wherein an inner portion of each of the convex portions of the plurality of trenches has a width so as to become fully depleted in an ON state of the semiconductor device.

19. A semiconductor device according to claim 14; wherein the semiconductor device has a twin-well construction.

20. A semiconductor device according to claim 14; wherein the first and second conductivity types are inverted conductivity types.

* * * * *